United States Patent
Park et al.

(10) Patent No.: US 8,145,935 B2
(45) Date of Patent: Mar. 27, 2012

(54) CLOCK SIGNAL GENERATOR FOR GENERATING STABLE CLOCK SIGNAL, SEMICONDUCTOR MEMORY DEVICE INCLUDING THE SAME, AND METHODS OF OPERATING

(75) Inventors: Sung Geun Park, Gyeonggi-do (KR); Chul Joon Choi, Suwon-si (KR); Hyuk Jun Sung, Gyeonggi-do (KR); Byung Yoon Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 565 days.

(21) Appl. No.: 12/188,820

(22) Filed: Aug. 8, 2008

(65) Prior Publication Data

US 2009/0049326 A1    Feb. 19, 2009

(30) Foreign Application Priority Data

Aug. 14, 2007  (KR) .......................... 10-2007-0081506

(51) Int. Cl.
 *G06F 1/041*    (2006.01)
(52) U.S. Cl. ........ 713/500; 713/501; 713/502; 713/503; 331/16; 331/17; 331/44
(58) Field of Classification Search .......... 713/500–503; 331/16, 17, 44
See application file for complete search history.

(56) References Cited

U.S. PATENT DOCUMENTS

| | | | |
|---|---|---|---|
| 5,657,361 A | * | 8/1997 | Inagaki et al. .................. 377/39 |
| 2003/0086518 A1 | | 5/2003 | Chakravarthy |
| 2005/0081076 A1 | | 4/2005 | Okuda |

FOREIGN PATENT DOCUMENTS

| | | |
|---|---|---|
| JP | 2004-234659 B1 | 8/2004 |
| KR | 1020020057697 A | 7/2002 |
| KR | 1020030038706 A | 5/2003 |
| KR | 1020050096030 A | 10/2005 |

OTHER PUBLICATIONS

Extended European Search Report (7 pages) corresponding to European Application No. 082526153; Dated: Feb. 2, 2009.

* cited by examiner

*Primary Examiner* — M Elamin
(74) *Attorney, Agent, or Firm* — Myers Bigel Sibley & Sajovec, P.A.

(57) ABSTRACT

A clock signal generator can include a clock signal generation unit that is configured to generate a clock signal. A clock signal control unit is configured to count a number of pulses of the clock signal during a reference time, and to compare the number of pulses with a reference value to provide a comparison result, and to generate a control signal based on the comparison result, where the clock signal generation unit increases or decreases the number of pulses of the clock signal based on the control signal.

9 Claims, 4 Drawing Sheets

CLOCK SIGNAL GENERATOR FOR GENERATING STABLE CLOCK SIGNAL, SEMICONDUCTOR MEMORY DEVICE INCLUDING THE SAME, AND METHODS OF OPERATING

CROSS-REFERENCE TO RELATED PATENT APPLICATION

This application claims the benefit of Korean Patent Application No. 10-2007-0081506, filed on Aug. 14, 2007, in the Korean Intellectual Property Office, the disclosure of which is incorporated herein in its entirety by reference.

FIELD OF THE INVENTION

The present invention relates to a semiconductor memory device, and more particularly, to a semiconductor memory device including a clock signal generator for generating a stable clock signal and method thereof.

BACKGROUND

Usually, a host can generate a stable clock signal used during data communication with a smart card and can thus generate a stable clock signal in the different communication modes of the USB. However, if smart card generates its own clock signal during the data communication with the host, the clock signal may be unstable. For example, even if the smart card locks onto the clock signal, the clock signal may be unstable due to environmental facts such as temperature and voltage of the smart card.

SUMMARY

Embodiments according to the invention can provide clock signal generator for generating stable clock signals, semiconductor memory device including the same, and methods of operating. Pursuant to these embodiments, a clock signal generator can include a clock signal generation unit that is configured to generate a clock signal. A clock signal control unit is configured to count a number of pulses of the clock signal during a reference time, and to compare the number of pulses with a reference value to provide a comparison result, and to generate a control signal based on the comparison result, where the clock signal generation unit increases or decreases the number of pulses of the clock signal based on the control signal.

BRIEF DESCRIPTION OF THE DRAWINGS

The above and other features and advantages of the present invention will become more apparent by describing in detail exemplary embodiments thereof with reference to the attached drawings in which.

DESCRIPTION OF EMBODIMENTS ACCORDING TO THE INVENTION

Figure 1:
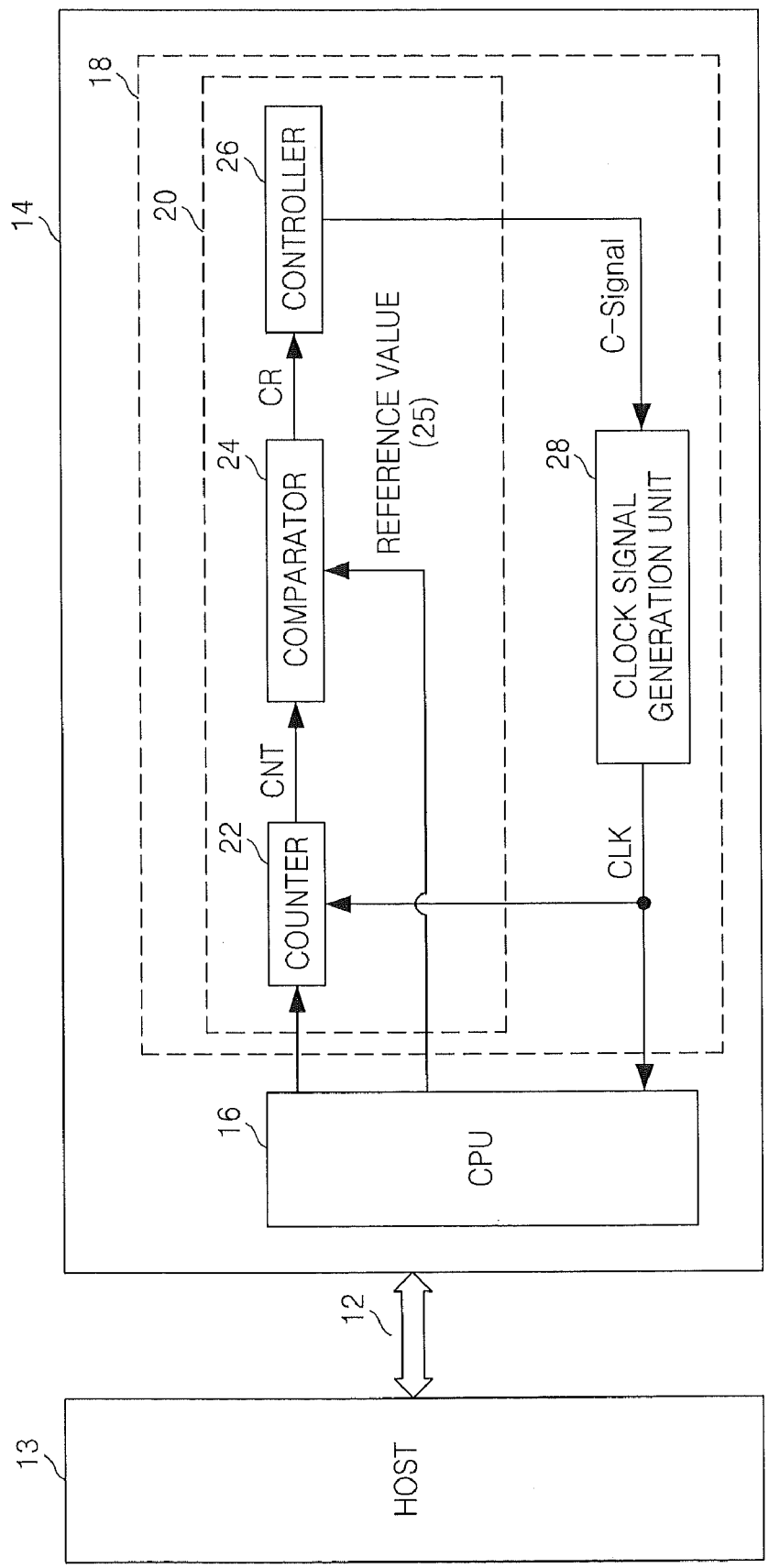
FIG. 1 is a block diagram of a semiconductor memory device according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
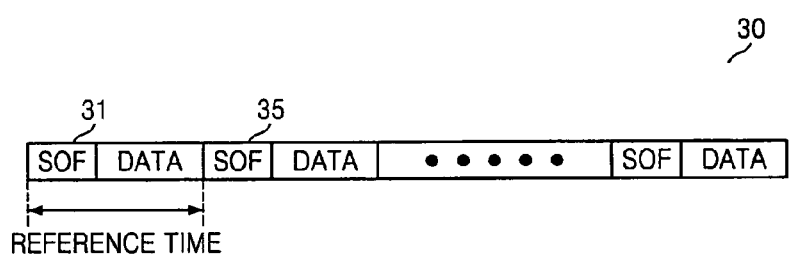
FIG. 2 illustrates a transmission frame which the semiconductor memory device illustrated in FIG. 1 receives from a host.

FIG. 1 is a block diagram of a semiconductor memory device 14 according to some embodiments of the present invention. FIG. 2 illustrates a transmission frame structure in which the semiconductor memory device 14 illustrated in FIG. 1 receives data from a host 13. Referring to FIGS. 1 and 2, the semiconductor memory device 14 may include a central processing unit (CPU) 16 and a clock signal generator 18. The CPU 16 and the clock signal generator 18 may be implemented on a single chip. The semiconductor memory device 14 may be at least one of a smart card and an S-subscriber identification module (S-SIM) card or may be a Compact-Flash (CF) card, a memory stick, a memory stick duo, a multimedia card (MMC), a reduced-size MMC, a secure digital (SD) card, a miniSD card, a microSD (or TransFlash) card, or an XD-picture card. Other form-factor cards can be used.

The CPU 16 transmits data to and receives data from the host 13 through a universal serial bus (USB) 12 based on a clock signal CLK generated by the clock signal generator 18 (sometimes referred to as the clock signal generator circuit). The USB 12 may be implemented by a four-wire cable and transfer a signal or a frame (FIG. 2) and power between the host 13 and the CPU 16. For instance, the USB 12 may transmit power from the host 13 to the semiconductor memory device 14 through two power supply lines (not shown) and transfer a signal (or a frame) between the host 13 and the CPU 16 through two signal lines (not shown). The host 13 may be a personal computer (PC), a video camera, a television, an MP3 player, a game, an electronic instrument, a mobile terminal, a personal digital assistant (PDA), a voice recorder, or a notebook computer.

The clock signal generator 18 generates the clock signal CLK, counts the number of pulses of the clock signal CLK during a reference time, compares a result of the counting with a reference value 25, and increases or decreases the number of pulses of the clock signal CLK based on a result of the comparison. In some embodiments according to the invention, the number of pulses of the clock signal CLK generated during the reference time is increased or decreased based on the comparison result.

The reference time may be determined based on a signal periodically generated by the host 13. For instance, the reference time may be a period of time from reception of a first start-of-frame (SOF) signal 31 sent by the host 13 through the USB 12 to reception of a second SOF signal 35 sent after the first SOF signal 31, but the present invention is not restricted thereto. Usually, when the USB 12 is used, data is time-divided into frames in the structure 30. A SOF signal indicating the start of each frame is generated at an interval of 1 ms. Accordingly, the clock signal generator 18 may detect the reference time based on the SOF signals 31 and 35 and count the number of pulses of the clock signal CLK during the detected reference time.

The clock signal generator 18 may include a clock signal control unit 20 and a clock signal generation unit 28. The clock signal control unit 20 counts the number of pulses of the clock signal CLK during the reference time, compares a counting result CNT with the reference value 25, and generates a control signal C-signal based on a comparison result CR.

The clock signal control unit 20 may include a counter 22, a comparator 24, and a controller 26. The counter 22 counts the number of pulses of the clock signal CLK during the reference time. For instance, the counter 22 starts counting the number of pulses of the clock signal CLK in response to the first SOF signal 31 received from the CPU 16 and is then reset in response to the second SOF signal 35 received after the first SOF signal 31, thereby outputting the counting result CNT. The comparator 24 compares the counting result CNT received from the counter 22 with the reference value 25 and outputs the comparison result CR. The controller 26 outputs the control signal C-signal for increasing or decreasing the number of pulses of the clock signal CLK based on the comparison result CR.

The reference value 25 indicates the number of pulses of a clock signal referred to when data is transferred between the host 13 and the CPU 16 through the USB 12 and may be input by a user and stored at a storage (not shown) included in the comparator 24 through a user interface (not shown) or may be received from the host 13 through the CPU 16 and stored at the storage (not shown) of the comparator 24. For instance, when the reference value 25 is 48,000, the comparator 24 compares the counting result CNT with the value of 48,000.

The controller 26 may output the control signal C-signal for maintaining the number of pulses of the clock signal CLK to the clock signal generation unit 28 when the counting result CNT is 48,000. The controller 26 may output the control signal C-signal for increasing the number of pulses of the clock signal CLK to the clock signal generation unit 28 when the counting result CNT is less than 48,000. The controller 26 may output the control signal C-signal for decreasing the number of pulses of the clock signal CLK to the clock signal generation unit 28 when the counting result CNT is greater than 48,000.

The clock signal generation unit 28 generates the clock signal CLK and increases or decreases the number of pulses of the clock signal CLK in response to the control signal C-signal output from the controller 26. The clock signal generation unit 28 may be implemented by a resistor-capacitor (RC) oscillator or a ring oscillator, but the present invention is not restricted thereto.

A clock signal generated in a conventional semiconductor memory device may be unstable when environmental factors such as internal temperature and voltage of the conventional semiconductor memory device even if it is locked. Contrarily, the semiconductor memory device 14 according to the current embodiments of the present invention includes the clock signal generator 18 that generates the stable clock signal CLK even when the environmental factors such as temperature and voltage change after the clock signal CLK is locked, thereby allowing efficient data communication with the host 13.

Figure 3:
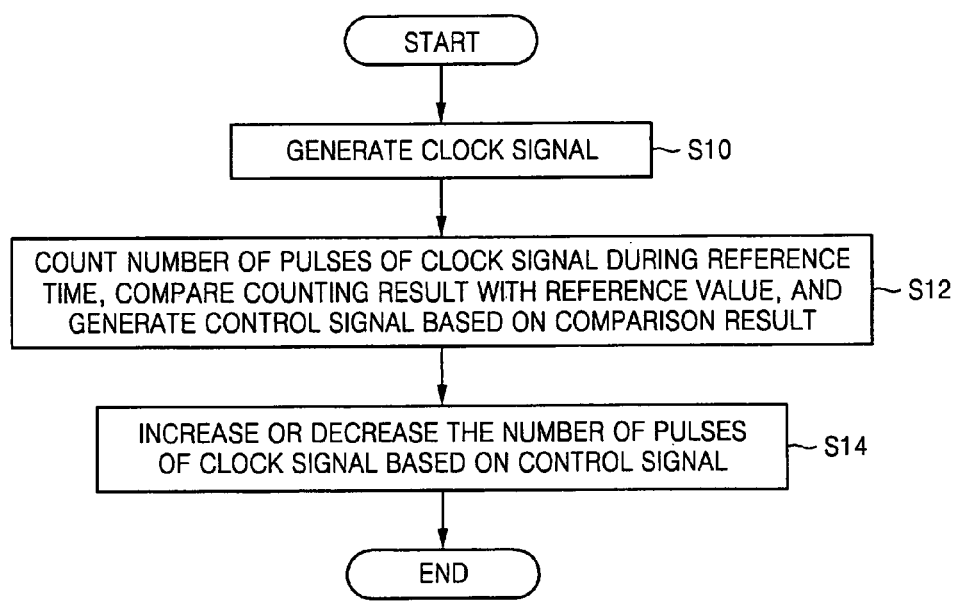
FIG. 3 is a flowchart of a method of generating a clock signal according to some embodiments of the present invention.

FIG. 3 is a flowchart of a method of generating a clock signal according to some embodiments of the present invention. Referring to FIGS. 1 and 3, the clock signal generation unit 28 generates the clock signal CLK in operation S10. The clock signal control unit 20 counts the number of pulses of the clock signal CLK during the reference time, compares the counting result CNT with the reference value 25, and generates the control signal C-signal based on the comparison result CR in operation S12. The clock signal generation unit 28 increases or decreases the number of pulses of the clock signal CLK based on the control signal C-signal in operation S14.

Figure 4:
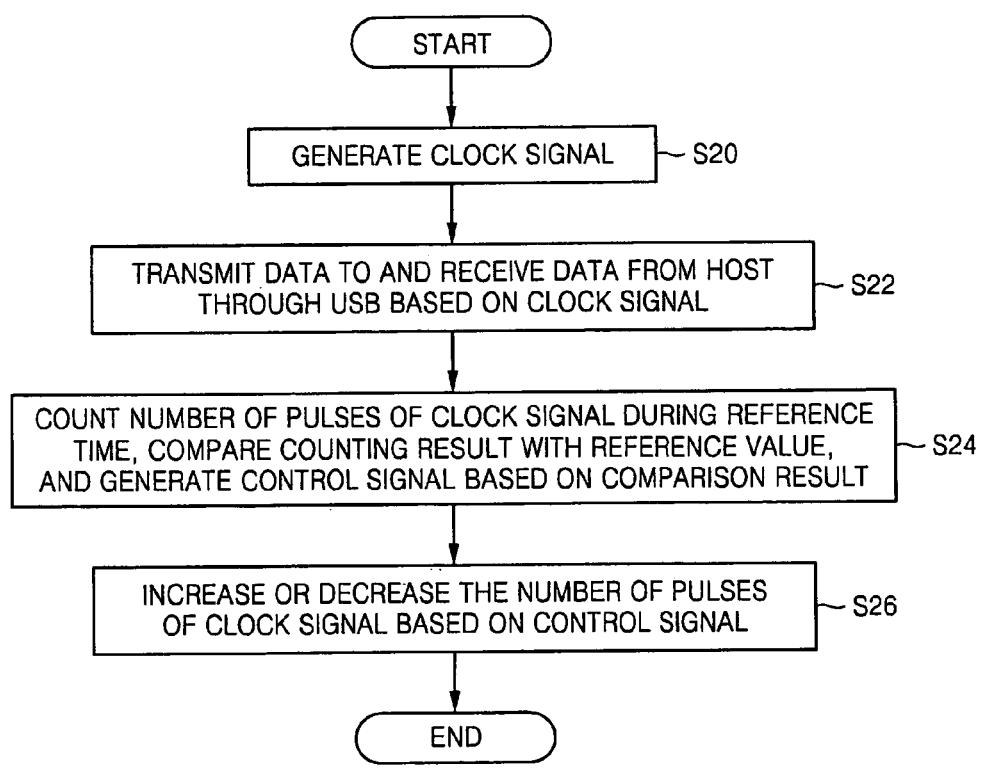
FIG. 4 is a flowchart of a method of transmitting and receiving data according to some embodiments of the present invention.

FIG. 4 is a flowchart of a method of transmitting and receiving data according to some embodiments of the present invention. Referring to FIGS. 1 and 4, the clock signal generation unit 28 generates the clock signal CLK in operation S20. The CPU 16 transmits data to and receives data from the host 13 through the USB 12 based on the clock signal CLK in operation S22. The clock signal control unit 20 counts the number of pulses of the clock signal CLK during the reference time, compares the counting result CNT with the reference value 25, and generates the control signal C-signal based on the comparison result CR in operation S24. The clock signal generation unit 28 increases or decreases the number of pulses of the clock signal CLK based on the control signal C-signal in operation S26.

As described above, according to some embodiments of the present invention, a clock signal generator can generate a stable clock signal regardless of environmental factors such as temperature and voltage. In addition, according to some embodiments of the present invention, a semiconductor memory device includes the clock signal generator that can generate a stable clock signal, thereby performing efficient data communication with a host using the stable clock signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A clock signal generator comprising:
a clock signal generation unit configured to generate a clock signal; and
a clock signal control unit configured to count a number of pulses of the clock signal during a reference time, compare the number of pulses with a reference value to provide a comparison result, and generate a control signal based on the comparison result,
wherein the clock signal generation unit increases or decreases the number of pulses of the clock signal based on the control signal, wherein the reference value comprises a re-programmable reference value stored in the clock signal control unit responsive to a host command from a host,
wherein the reference time is a period of time from reception of a first start-of-frame signal transmitted from the host through a universal serial bus to reception of a second start-of-frame signal transmitted from the host after the first start-of-frame signal.

2. The clock signal generator of claim 1, wherein the clock signal control unit comprises:
a counter configured to count the number of pulses of the clock signal during the reference time;
a comparator configured to compare the number of pulses output from the counter with the reference value and outputting the comparison result; and
a controller configured to generate the control signal for increasing or decreasing the number of pulses of the clock signal generated by the clock signal generation unit based on the comparison result.

3. A method of generating a clock signal, comprising:
generating a clock signal;
programming a reference value into a storage location responsive to a host command;
counting a number of pulses of the clock signal during a reference time;
comparing the number of pulses with the reference value to provide a comparison result; and
generating a control signal based on the comparison result, wherein the number of pulses of the clock signal is increased or decreased based on the control signal, wherein the reference time is a period of time from reception of a first start-of-frame signal transmitted from the host through a universal serial bus to reception of a second start-of-frame signal transmitted from the host after the first start-of-frame signal.

4. A semiconductor memory device comprising:
a clock signal generator configured to generate a clock signal; and
a central processing unit configured to transmit data to and receive data from a host through a universal serial bus based on the clock signal,
wherein the clock signal generator counts the number of pulses of the clock signal during a reference time, compares a counting result with a reference value, and increases or decreases the number of pulses of the clock signal based on a comparison result, wherein the reference value comprises a re-programmable reference value stored in the memory device responsive to a host command from the host, wherein the reference time is a period of time from reception of a first start-of-frame signal transmitted from the host through the universal serial bus to reception of a second start-of-frame signal transmitted from the host after the first start-of-frame signal.

5. The semiconductor memory device of claim 4, wherein the clock signal generator comprises:
a clock signal generation unit configured to generate the clock signal; and
a clock signal control unit configured to count the number of pulses of the clock signal during the reference time, compare the counting result with the reference value, and generate a control signal based on the comparison result,
wherein the clock signal generation unit increases or decreases the number of pulses of the clock signal based on the control signal.

6. The semiconductor memory device of claim 5, wherein the clock signal control unit comprises:
a counter configured to count the number of pulses of the clock signal during the reference time;
a comparator configured to compare the counting result output from the counter with the reference value and outputting the comparison result; and
a controller configured to generate the control signal for increasing or decreasing the number of pulses of the clock signal based on the comparison result.

7. The semiconductor memory device of claim 4, wherein the semiconductor memory device is at least one of a smart card and an S-subscriber identification module (SIM) card.

8. A method of transmitting and receiving data, comprising:
generating a clock signal;
programming a reference value into a storage location responsive to a host command from a host;
transmitting data to and receiving data from the host through a universal serial bus based on the clock signal,
wherein the number of pulses of the clock signal is increased or decreased based on a result of comparing the number of pulses of the clock signal counted during a reference time with the reference value, wherein the reference time is a period of time from reception of a first start-of-frame signal transmitted from the host through a universal serial bus to reception of a second start-of-frame signal transmitted from the host after the first start-of-frame signal.

9. A recording medium for recording a computer program for executing the method of claim 8.

* * * * *